(12) United States Patent
Hara et al.

(10) Patent No.: US 8,629,948 B2
(45) Date of Patent: Jan. 14, 2014

(54) LIQUID CRYSTAL DISPLAY PANEL AND METHOD FOR FABRICATING SAME, AND ARRAY SUBSTRATE AND METHOD FOR FABRICATING SAME

(75) Inventors: Yoshihito Hara, Osaka (JP); Yukinobu Nakata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/884,704

(22) PCT Filed: Jan. 24, 2012

(86) PCT No.: PCT/JP2012/000420
§ 371 (c)(1),
(2), (4) Date: May 10, 2013

(87) PCT Pub. No.: WO2012/105180
PCT Pub. Date: Aug. 9, 2012

(65) Prior Publication Data
US 2013/0235292 A1 Sep. 12, 2013

(30) Foreign Application Priority Data
Jan. 31, 2011 (JP) .................................. 2011-018806

(51) Int. Cl.
*G02F 1/1343* (2006.01)
*G02F 1/136* (2006.01)
*G02F 1/1333* (2006.01)

(52) U.S. Cl.
USPC .................. 349/38; 349/43; 349/54; 349/55; 349/192

(58) Field of Classification Search
USPC .................. 349/38, 43, 54–55, 192
See application file for complete search history.

(56) References Cited

U.S. PATENT DOCUMENTS

| | | | |
|---|---|---|---|
| 2007/0159570 A1* | 7/2007 | Nagasawa | 349/54 |
| 2009/0322715 A1* | 12/2009 | Hirato | 345/204 |
| 2011/0149184 A1* | 6/2011 | Tsai et al. | 349/38 |

FOREIGN PATENT DOCUMENTS

JP 09-179143 A 7/1997

OTHER PUBLICATIONS

Official Communication issued in International Patent Application No. PCT/JP2012/000420, mailed on Apr. 3, 2012.

\* cited by examiner

*Primary Examiner* — Nathanael R Briggs
(74) *Attorney, Agent, or Firm* — Keating & Bennett, LLP

(57) ABSTRACT

A liquid crystal display panel includes: a plurality of switching elements each provided on a transparent substrate (10) for each sub-pixel and having a drain electrode (14b); an interlayer insulating film (17) provided to cover the switching elements and including an inorganic insulating film (15) and an organic insulating film (16) sequentially layered; a capacitor electrode (18a) provided on the interlayer insulating film (17); a capacitor insulating film (19) provided to cover the capacitor electrode (18a); a plurality of pixel electrodes (20a) which are provided on the capacitor insulating film (19) and face the capacitor electrode (18a); and a connection region (R) at which the drain electrode (14b) and the capacitor electrode (18a) overlap each other via the inorganic insulating film (15) exposed from the organic insulating film (16).

15 Claims, 7 Drawing Sheets

LIQUID CRYSTAL DISPLAY PANEL AND METHOD FOR FABRICATING SAME, AND ARRAY SUBSTRATE AND METHOD FOR FABRICATING SAME

TECHNICAL FIELD

The present disclosure relates to liquid crystal display panels and methods for fabricating the liquid crystal display panels, and array substrates and methods for fabricating the array substrates, and specifically relates to techniques for repairing a defect by turning the defect to a black spot in a liquid crystal display panel and an array substrate which comprises the liquid crystal display panel.

BACKGROUND ART

Liquid crystal display panels include, for example, a TFT array substrate on which a thin film transistor (hereinafter also referred to as "TFT") is provided for each sub-pixel as a minimum unit of an image, a counter substrate facing the TFT array substrate, and a liquid crystal layer provided between the TFT array substrate and the counter substrate.

The TFT array substrate includes, for example, a plurality of gate lines extending in parallel to each other, a plurality of capacitor lines each provided between the gate lines and extending in parallel to each other, a gate insulating film which covers the gate lines and the capacitor lines, a plurality of source lines provided on the gate insulating film and extending in parallel to each other in a direction perpendicular to the gate lines, a plurality of TFTs provided for each of the intersections of the gate lines and the source lines, an interlayer insulating film which covers the TFTs and the source lines, and a plurality of pixel electrodes provided in a matrix pattern on the interlayer insulating film and connected to a corresponding one of the TFTs.

Each TFT includes, for example, a gate electrode provided on a transparent substrate, such as a glass substrate, a gate insulating film which covers the gate electrode, an island-shaped semiconductor layer provided on the gate insulating film so as to overlap with the gate electrode, and a source electrode and a drain electrode provided on the semiconductor layer so as to be apart from each other. Here, the gate electrode is a laterally protruding portion of the gate line. The source electrode is a laterally protruding portion of the source line. The drain electrode is connected to the pixel electrode via a contact hole formed in the interlayer insulating film, and comprises an auxiliary capacitor by overlapping with the capacitor line via the gate insulating film.

In the liquid crystal display panel, the source electrode and the drain electrode of the TFT provided for each sub-pixel may be short-circuited if, for example, conductive foreign substances or film residues intervene between the source electrode and the drain electrode. If such an event occurs, a display signal from the source line is input to the pixel electrode of that sub-pixel all the time, and the sub-pixel is easily detected as a bright spot. Thus, at the sub-pixel detected as a bright spot, a defect repair is performed to turn the bright spot into a black spot by, for example, disconnecting the drain electrode and connecting a side of the disconnected drain electrode which is connected to a pixel electrode, with the gate line or the capacitor line.

For example, Patent Document 1 discloses a method for repairing a faulty pixel in a TFT type liquid crystal display device in which a data signal (a display signal) is not applied to a pixel electrode of the faulty pixel from a data bus line (a source line). According to the method, a portion of a TFT gate electrode which is connected to a gate bus line (a gate line) is irradiated with optical energy, thereby electrically connecting the gate electrode and the pixel electrode of the faulty pixel via a drain electrode, and applying a scan signal of the gate bus line to the pixel electrode of the faulty pixel.

In the repair method in which a drain electrode and a gate line are electrically connected to each other as disclosed in Patent Document 1, a bright spot may not sometimes be turned into a black spot, but detected as a halftone, depending on tone characteristics of the liquid crystal layer. Thus, a method in which a drain electrode and a capacitor line are electrically connected to turn a bright spot into a black spot is a mainstream repair method in fabricating liquid crystal display panels.

CITATION LIST

Patent Document

Patent Document 1: Japanese Patent Publication No. H9-179143

SUMMARY OF THE INVENTION

Technical Problem

The TFT array substrate having the above configuration has a low aperture ratio due to the light blocking effect of the capacitor lines placed in each of the sub-pixels. Thus, a TFT array substrate having a high aperture ratio is suggested in which the aperture ratio is improved by sequentially providing, instead of providing the capacitor lines, a transparent capacitor electrode and an insulating film between the interlayer insulating film and each of the pixel electrodes, thereby forming an auxiliary capacitor comprised of the capacitor electrode, the pixel electrode, and the insulating film therebetween.

However, in this TFT array substrate having a high aperture ratio, if the interlayer insulating film is comprised of a multilayer film in which a relatively thin inorganic insulating film and a relatively thick organic insulating film are sequentially layered, it is difficult to electrically connect the drain electrode and the capacitor electrode which corresponds to the capacitor line, by irradiating a connection portion with laser light from the transparent substrate side to repair a defect by turning the defect into a black spot. This may be because even if a metal of the drain electrode is diffused in the interlayer insulating film by the laser light irradiation, the metal of the drain electrode does not reach the capacitor electrode which corresponds to the capacitor line because the organic insulating film comprising the interlayer insulating film is relatively thick. On the other hand, in the TFT array substrate having a low aperture ratio, the metal of the capacitor line is diffused in the relatively thin gate insulating film, and reaches the drain electrode, by irradiating the connection portion with laser light from the transparent substrate side. Accordingly, the drain electrode and the capacitor line are electrically connected to each other, and a defect can be repaired by turning the defect into a black spot.

Thus, it is an objective of the present disclosure to reliably connect a drain electrode and a capacitor electrode in repairing a defect by turning the defect into a black spot.

Solution to the Problem

To achieve the above objective, in the present disclosure, an interlayer insulating film between a drain electrode and a capacitor electrode is formed by sequentially layering an inorganic insulating film and an organic insulating film, and a connection region is provided at which the drain electrode and the capacitor electrode overlap each other via the inorganic insulating film exposed from the organic insulating film.

Specifically, a liquid crystal display panel according to the present disclosure includes: a plurality of sub-pixels; an array substrate and a counter substrate which face each other; and a liquid crystal layer provided between the array substrate and the counter substrate, and the array substrate including a plurality of switching elements each provided on a transparent substrate for a corresponding one of the plurality of sub-pixels and having a source electrode and a drain electrode spaced apart from each other, an interlayer insulating film provided so as to cover the plurality of switching elements and including an inorganic insulating film and an organic insulating film sequentially layered, a capacitor electrode provided on the interlayer insulating film, a capacitor insulating film provided so as to cover the capacitor electrode, and a plurality of pixel electrodes which are provided on the capacitor insulating film to face the capacitor electrode, and each of which forms an auxiliary capacitor for a corresponding one of the plurality of sub-pixels, and is connected to the drain electrode of a corresponding one of the plurality of switching elements, while being insulated from the capacitor electrode, wherein the array substrate includes a connection region at which the drain electrode and the capacitor electrode overlap each other via the inorganic insulating film exposed from the organic insulating film.

According to the above configuration, the interlayer insulating film between the drain electrode and the capacitor electrode is formed by sequentially layering the inorganic insulating film and the organic insulating film in the array substrate, and the array substrate has the connection region where the drain electrode and the capacitor electrode overlap each other via the inorganic insulating film exposed from the organic insulating film. This means that in the connection region where the drain electrode and the capacitor electrode overlap each other, the relatively thick organic insulating film is not provided, but only the relatively thin inorganic insulating film is provided as an insulating film for electrically insulating between the drain electrode and the capacitor electrode. Thus, if a sub-pixel in which a short-circuit has occurred between the source electrode and the drain electrode is detected as a bright spot, the drain electrode of the sub-pixel in which the short-circuit has occurred is irradiated with laser light from the transparent substrate side, for example. As a result, the metal of the drain electrode is diffused in the interlayer insulating film (that is, the inorganic insulating film and the organic insulating film), and the drain electrode is disconnected. Also, the connection region where the drain electrode and the capacitor electrode overlap each other via the inorganic insulating film is irradiated with laser light from the transparent substrate side. As a result, the metal of the drain electrode is diffused in the relatively thin inorganic insulating film, and easily reaches the capacitor electrode. Consequently, a side of the disconnected drain electrode which side is connected to the pixel electrode is connected to the capacitor electrode with reliability. Thus, in the sub-pixel in which the short-circuit has occurred, the potential of the pixel electrode is fixed to the potential of the capacitor electrode (e.g., ground potential), and the bright spot is turned into a black spot. Thus, the drain electrode and the capacitor electrode are connected to each other with reliability in repairing a defect of the liquid crystal display panel by turning the defect into a black spot.

Each of the plurality of pixel electrodes may be provided with an opening which overlaps the connection region.

According to the above configuration, each of the pixel electrodes is provided with an opening which overlaps the connection region and functions as a structure controlling the alignment of the liquid crystal layer, for example. Damage of the pixel electrode due to the irradiation of the connection region with the laser light is thus reduced.

In the connection region of the array substrate, a gate insulating film, the drain electrode, the inorganic insulating film, the capacitor electrode, the capacitor insulating film, and each of the plurality of pixel electrodes may be sequentially layered on the transparent substrate.

According to the above configuration, the connection region of the array substrate has a multilayered structure of the pixel electrode (the uppermost layer)/the capacitor insulating film/the capacitor electrode/the inorganic insulating film/the drain electrode/the gate insulating film/the transparent substrate (the lowermost layer). Thus, the substrate structure is such that the drain electrode and the capacitor electrode can be reliably connected to each other.

A method for fabricating a liquid crystal display panel according to the present disclosure, the liquid crystal display panel including a plurality of sub-pixels; an array substrate and a counter substrate which face each other; and a liquid crystal layer provided between the array substrate and the counter substrate, and the array substrate including a plurality of switching elements each provided on a transparent substrate for a corresponding one of the plurality of sub-pixels and having a source electrode and a drain electrode spaced apart from each other, an interlayer insulating film provided so as to cover the plurality of switching elements and including an inorganic insulating film and an organic insulating film sequentially layered, a capacitor electrode provided on the interlayer insulating film, a capacitor insulating film provided so as to cover the capacitor electrode, a plurality of pixel electrodes which are provided on the capacitor insulating film to face the capacitor electrode, and each of which forms an auxiliary capacitor for a corresponding one of the plurality of sub-pixels, and is connected to the drain electrode of a corresponding one of the plurality of switching elements, while being insulated from the capacitor electrode, and the array substrate including a connection region at which the drain electrode and the capacitor electrode overlap each other via the inorganic insulating film exposed form the organic insulating film, the method including: a detection step for detecting, in the plurality of sub-pixels, a sub-pixel in which a short-circuit has occurred between the source electrode and the drain electrode; and a repair step in which the drain electrode of the sub-pixel detected as having the short-circuit in the detection step is irradiated with laser light from a transparent substrate side, thereby disconnecting the drain electrode, and in which the connection region is irradiated with laser light from the transparent substrate side, thereby connecting a side of the disconnected drain electrode which side is connected to a corresponding one of the pixel electrodes, with the capacitor electrode.

According to the above method, the interlayer insulating film between the drain electrode and the capacitor electrode is formed by sequentially layering the inorganic insulating film and the organic insulating film in the array substrate, and the array substrate has the connection region where the drain electrode and the capacitor electrode overlap each other via the inorganic insulating film exposed from the organic insulating film. This means that in the connection region where the drain electrode and the capacitor electrode overlap each other, the relatively thick organic insulating film is not provided, but only the relatively thin inorganic insulating film is provided as an insulating film for electrically insulating between the drain electrode and the capacitor electrode. Thus, if a sub-pixel in which a short-circuit has occurred between the source electrode and the drain electrode is detected as a bright spot in the detection step by, for example, a dynamic operating inspection, the drain electrode of the sub-pixel in which the short-circuit has occurred is irradiated with laser light from the transparent substrate side in the repair step. As a result, the metal of the drain electrode is diffused in the interlayer insulating film (that is, the inorganic insulating film and the organic insulating film), and the drain electrode is disconnected. Also, the connection region where the drain electrode and the capacitor electrode overlap each other via the inorganic insulating film is irradiated with laser light from the transparent substrate side in the repair step. As a result, the metal of the drain electrode is diffused in the relatively thin inorganic insulating film, and easily reaches the capacitor electrode. Consequently, a side of the disconnected drain electrode which side is connected to the pixel electrode is connected to the capacitor electrode with reliability. Thus, in the sub-pixel in which the short-circuit has occurred, the potential of the pixel electrode is fixed to the potential of the capacitor electrode (e.g., ground potential), and the bright spot is turned into a black spot. Thus, the drain electrode and the capacitor electrode are connected to each other with reliability in repairing a defect of the liquid crystal display panel by turning the defect into a black spot.

In the repair step, the connection region may be irradiated with the laser light at an edge portion thereof and an area outside the connection region that is adjacent to the edge portion.

According to the above method, an edge portion of the connection region and an area outside the connection region which is adjacent to the edge portion are irradiated with laser light in the repair step. This means that the irradiation with the laser light is not concentrated only onto the connection region. Thus, excessive diffusion of the metal of the drain electrode is reduced, and the drain electrode and the capacitor electrode are connected to each other with more reliability.

Further, an array substrate according to the present disclosure includes: a plurality of sub-pixels; a plurality of switching elements each provided on a transparent substrate for a corresponding one of the plurality of sub-pixels and having a source electrode and a drain electrode spaced apart from each other; an interlayer insulating film provided so as to cover the plurality of switching elements and including an inorganic insulating film and an organic insulating film sequentially layered; a capacitor electrode provided on the interlayer insulating film; a capacitor insulating film provided so as to cover the capacitor electrode; and a plurality of pixel electrodes which are provided on the capacitor insulating film to face the capacitor electrode, and each of which forms an auxiliary capacitor for a corresponding one of the plurality of sub-pixels, and is connected to the drain electrode of a corresponding one of the plurality of switching elements, while being insulated from the capacitor electrode, wherein the array substrate includes a connection region at which the drain electrode and the capacitor electrode overlap each other via the inorganic insulating film exposed from the organic insulating film.

According to the above configuration, the interlayer insulating film between the drain electrode and the capacitor electrode is formed by sequentially layering the inorganic insulating film and the organic insulating film, and the array substrate has the connection region where the drain electrode and the capacitor electrode overlap each other via the inorganic insulating film exposed from the organic insulating film. This means that in the connection region where the drain electrode and the capacitor electrode overlap each other, the relatively thick organic insulating film is not provided, but only the relatively thin inorganic insulating film is provided as an insulating film for electrically insulating between the drain electrode and the capacitor electrode. Thus, if a sub-pixel in which a short-circuit has occurred between the source electrode and the drain electrode is detected, the drain electrode of the sub-pixel in which the short-circuit has occurred is irradiated with laser light from a transparent substrate side, for example. As a result, the metal of the drain electrode is diffused in the interlayer insulating film (that is, the inorganic insulating film and the organic insulating film), and the drain electrode is disconnected. Also, the connection region where the drain electrode and the capacitor electrode overlap each other via the inorganic insulating film is irradiated with laser light from the transparent substrate side. As a result, the metal of the drain electrode is diffused in the relatively thin inorganic insulating film, and easily reaches the capacitor electrode. Consequently, a side of the disconnected drain electrode which side is connected to the pixel electrode is connected to the capacitor electrode with reliability. Thus, in the sub-pixel in which the short-circuit has occurred, the potential of the pixel electrode is fixed to the potential of the capacitor electrode (e.g., ground potential), and the bright spot is turned into a black spot. Thus, the drain electrode and the capacitor electrode are connected to each other with reliability in repairing a defect of the array substrate by turning the defect into a black spot.

Further, a method for fabricating an array substrate according to the present disclosure, the array substrate including: a plurality of sub-pixels; a plurality of switching elements each provided on a transparent substrate for a corresponding one of the plurality of sub-pixels and having a source electrode and a drain electrode spaced apart from each other; an interlayer insulating film provided so as to cover the plurality of switching elements and including an inorganic insulating film and an organic insulating film sequentially layered; a capacitor electrode provided on the interlayer insulating film; a capacitor insulating film provided so as to cover the capacitor electrode; a plurality of pixel electrodes which are provided on the capacitor insulating film to face the capacitor electrode, and each of which forms an auxiliary capacitor for a corresponding one of the plurality of sub-pixels, and is connected to the drain electrode of a corresponding one of the plurality of switching elements, while being insulated from the capacitor electrode; and a connection region at which the drain electrode and the capacitor electrode overlap each other via the inorganic insulating film exposed from the organic insulating film, the method including a detection step for detecting, in the plurality of sub-pixels, a sub-pixel in which a short-circuit has occurred between the source electrode and the drain electrode, and a repair step in which the drain electrode of the sub-pixel detected as having the short-circuit in the detection step is irradiated with laser light from a transparent substrate side, thereby disconnecting the drain electrode, and in which the connection region is irradiated with laser light from the transparent substrate side, thereby connecting a side of the disconnected drain electrode which side is connected to a corresponding one of the pixel electrodes, with the capacitor electrode.

According to the above method, the interlayer insulating film between the drain electrode and the capacitor electrode is formed by sequentially layering the inorganic insulating film and the organic insulating film, and the array substrate has the connection region where the drain electrode and the capacitor electrode overlap each other via the inorganic insulating film exposed from the organic insulating film. This means that in the connection region where the drain electrode and the capacitor electrode overlap each other, the relatively thick organic insulating film is not provided, but only the thin inorganic insulating film is provided as an insulating film for electrically insulating between the drain electrode and the capacitor electrode. Thus, if a sub-pixel is detected as having a short-circuit between the source electrode and the drain electrode by an optical inspection or an inspection by a charge detection method in the detection step, the drain electrode of the sub-pixel in which the short-circuit has occurred is irradiated with laser light from the transparent substrate side in the repair step. As a result, the metal of the drain electrode is diffused in the interlayer insulating film (that is, the inorganic insulating film and the organic insulating film), and the drain electrode is disconnected. Also, the connection region where the drain electrode and the capacitor electrode overlap each other via the inorganic insulating film is irradiated with laser light from the transparent substrate side in the repair step. As a result, the metal of the drain electrode is diffused in the relatively thin inorganic insulating film, and easily reaches the capacitor electrode. Consequently, a side of the disconnected drain electrode which side is connected to the pixel electrode is connected to the capacitor electrode with reliability. Thus, in the sub-pixel in which the short-circuit has occurred, the potential of the pixel electrode is fixed to the potential of the capacitor electrode (e.g., ground potential), and a bright spot is turned into a black spot. Thus, the drain electrode and the capacitor electrode are connected to each other with reliability in repairing a defect of the array substrate by turning the defect into a black spot.

Advantages of the Invention

According to the present disclosure, an interlayer insulating film between a drain electrode and a capacitor electrode is formed by sequentially layering an inorganic insulating film and an organic insulating film, and a connection region is provided at which the drain electrode and the capacitor electrode overlap each other via the inorganic insulating film exposed from the organic insulating film. Thus, the drain electrode and the capacitor electrode can be reliably connected in repairing a defect by turning the defect into a black spot.

DESCRIPTION OF EMBODIMENTS

Embodiments of the present disclosure will be described in detail below based on the drawings. The present disclosure is not limited to the following embodiments.

First Embodiment of Invention

Figure 1:
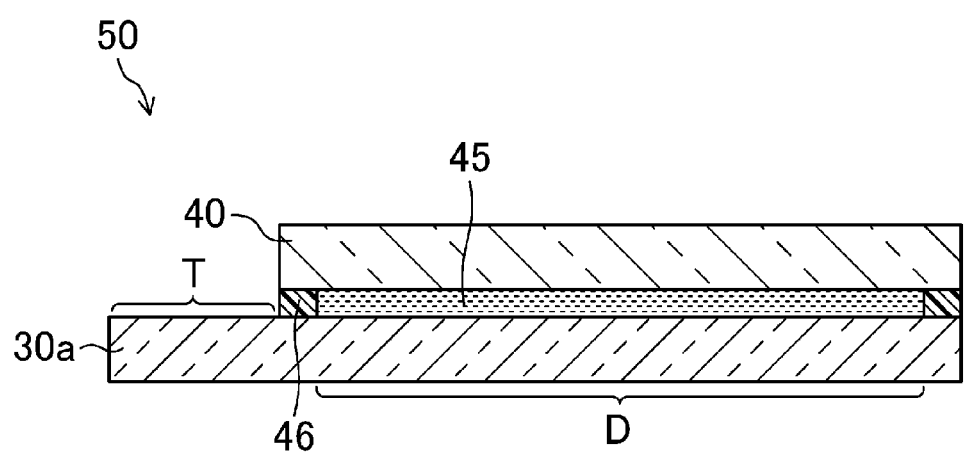
FIG. 1 is a cross-sectional view of a liquid crystal display panel according to the first embodiment.
Figure 2:
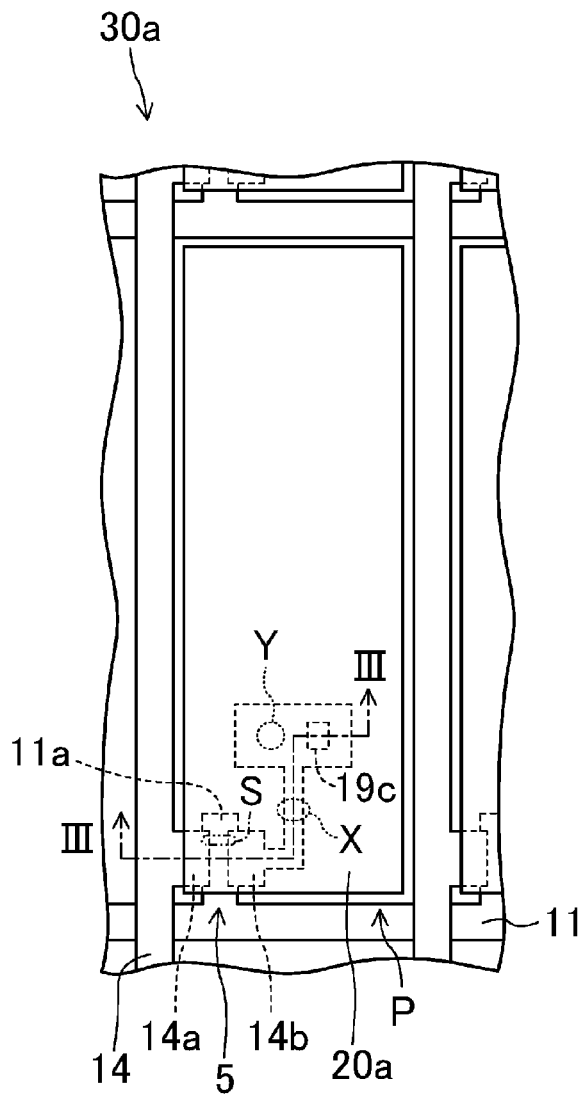
FIG. 2 is a plan view of a sub-pixel in a TFT array substrate which comprises the liquid crystal display panel of the first embodiment.
Figure 3:
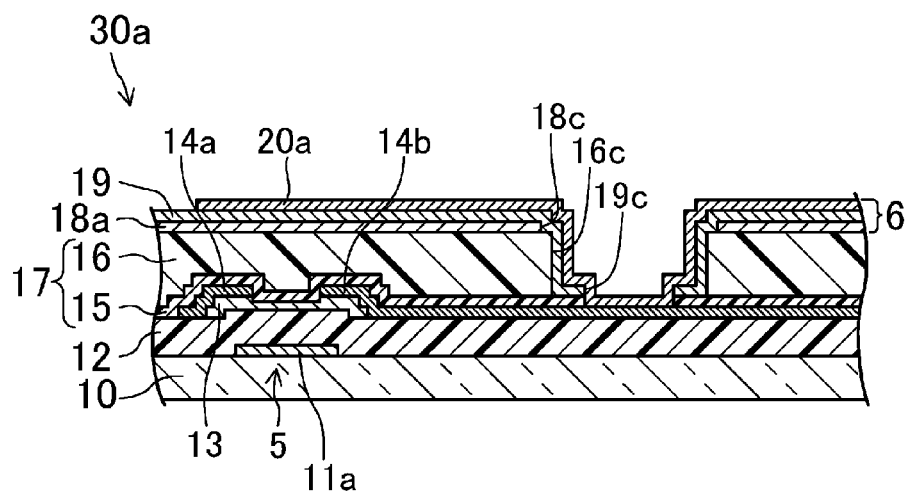
FIG. 3 is a cross-sectional view of the TFT array substrate taken along the line III-III of FIG. 2.
Figure 4:
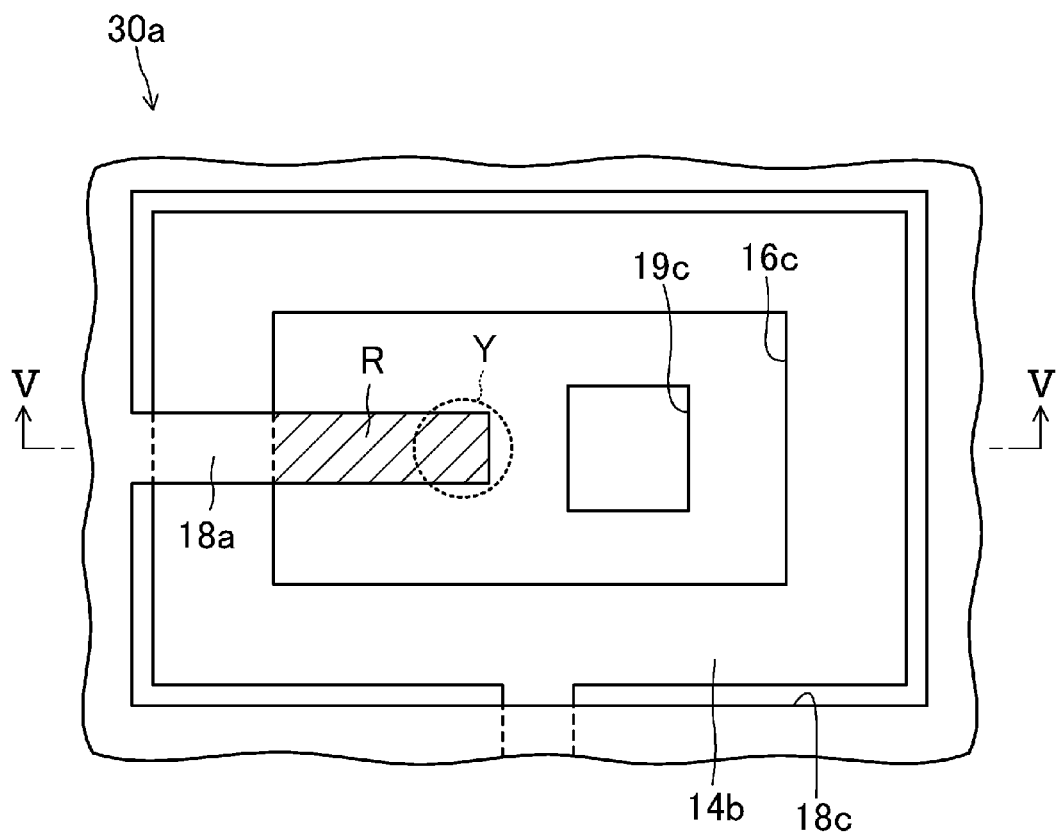
FIG. 4 is an enlarged plan view of a connection region provided at each sub-pixel in the TFT array substrate, and a region adjacent to the connection region.
Figure 5:
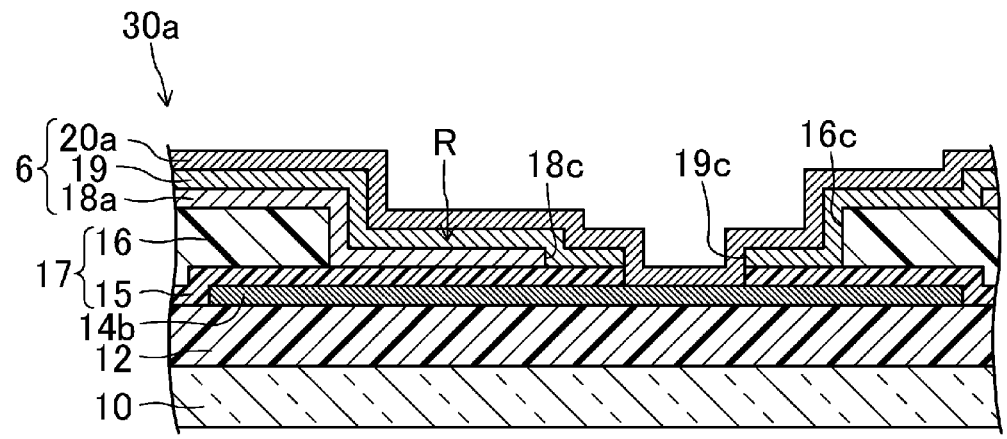
FIG. 5 is a cross-sectional view of the TFT array substrate taken along the line V-V of FIG. 4.

FIG. 1 to FIG. 7 show a liquid crystal display panel and a method for fabricating the liquid crystal display panel according to the first embodiment of the present disclosure. Specifically, FIG. 1 is a cross-sectional view of a liquid crystal display panel 50 of the present embodiment. FIG. 2 is a plan view of a sub-pixel P in a TFT array substrate 30a which comprises the liquid crystal display panel 50. FIG. 3 is a cross-sectional view of the TFT array substrate 30a taken along the line III-III of FIG. 2. FIG. 4 is an enlarged plan view of a connection region R at the sub-pixel P in the TFT array substrate 30a, and a region adjacent to the connection region R. FIG. 5 is a cross-sectional view of the TFT array substrate 30a taken along the line V-V of FIG. 4.

As shown in FIG. 1, the liquid crystal display panel 50 includes: a TFT array substrate 30a and a counter substrate 40 which face each other; a liquid crystal layer 45 provided between the TFT array substrate 30a and the counter substrate 40; and a sealing material 46 in a frame-like shape which bonds the TFT array substrate 30a and the counter substrate 40 together and encloses the liquid crystal layer 45 between the TFT array substrate 30a and the counter substrate 40. Here, in the liquid crystal display panel 50, a surface of the TFT array substrate 30a protruding from the counter substrate 40 is defined as a terminal region T, and a region surrounded by the sealing material 46 is defined as a display region D, as shown in FIG. 1. A plurality of sub-pixels P (see FIG. 2) are arranged in a matrix in the display region D.

As shown in FIG. 2 and FIG. 3, the TFT array substrate 30a includes: a transparent substrate 10; a plurality of gate lines 11 provided on the transparent substrate 10 and extending in parallel to each other; a gate insulating film 12 provided so as to cover the gate lines 11; a plurality of source lines 14 provided on the gate insulating film 12 and extending in parallel to each other in a direction perpendicular to the gate lines 11; a plurality of TFTs 5 each of which is provided for an intersection of the gate line 11 and the source line 14, that is, provided for each of the sub-pixels P; an interlayer insulating film 17 provided so as to cover the TFTs 5 and the source lines 14; a capacitor electrode 18a provided on the interlayer insulating film 17; a capacitor insulating film 19 provided so as to cover the capacitor electrode 18a; a plurality of pixel electrodes 20a which are provided in a matrix manner on the capacitor insulating film 19 and each of which is connected to a corresponding one of the TFTs 5; and an alignment film (not shown) provided so as to cover the pixel electrodes 20a.

As shown in FIG. 2 and FIG. 3, each of the TFTs 5 includes: a gate electrode 11a provided on the transparent substrate 10; the gate insulating film 12 provided so as to cover the gate electrode 11a; an island-shaped semiconductor layer 13 provided on the gate insulating film 12 so as to overlap with the gate electrode 11a; and a source electrode 14a and a drain electrode 14b provided on the semiconductor layer 13 so as to be apart from each other.

As shown in FIG. 2, the gate electrode 11a is a laterally protruding portion of the gate line 11 for each sub-pixel P. In the present embodiment, the gate electrode 11a that is a laterally protruding portion of the gate line 11 is illustrated, but the gate electrode may be part of the linearly extending gate line 11.

The semiconductor layer 13 includes, for example, an intrinsic amorphous silicon layer (not shown) having a channel region, and an $n^+$ amorphous silicon layer (not shown) provided on the intrinsic amorphous silicon layer such that the channel region is exposed, and connected to the source electrode 14a and the drain electrode 14b. In the present embodiment, the semiconductor layer 13 made of amorphous silicon is illustrated, but the semiconductor layer 13 may be made, for example, of polysilicon or an In—Ga—Zn—O based oxide semiconductor.

As shown in FIG. 2, the source electrode 14a is a laterally protruding portion of the source line 14 for each sub-pixel P. In the present embodiment, the source electrode 14a that is a laterally protruding portion of the source line 14 is illustrated, but the source electrode may be part of the linearly extending source line 14.

As shown in FIG. 2 and FIG. 3, the drain electrode 14b is connected to the pixel electrode 20a, while being insulated from the capacitor electrode 18a, that is, via a contact hole 19c formed in the capacitor insulating film 19 covering the capacitor electrode 18a.

As shown in FIG. 3 to FIG. 5, the capacitor electrode 18a is integrally formed across the sub-pixels P, and is provided with an opening 18c for each sub-pixel P at a connection portion where the drain electrode 14b and the pixel electrode 20a are connected to each other. As shown in FIG. 3 and FIG. 5, the capacitor electrode 18a faces the pixel electrode 20a with the capacitor insulating film 19 interposed therebetween, thereby forming an auxiliary capacitor 6 for each sub-pixel P. Further, as shown in FIG. 4, the capacitor electrode 18a protrudes to a left middle portion of the opening 16c of an organic insulating film 16 described later.

As shown in FIG. 3 and FIG. 5, the interlayer insulating film 17 includes an inorganic insulating film 15 closer to the transparent substrate 10, and an organic insulating film 16 layered on the inorganic insulating film 15. The organic insulating film 16, as shown in FIG. 3 to FIG. 5, is provided with an opening 16c at a connection portion where the drain electrode 14b and the pixel electrode 20a are connected to each other. The inorganic insulating film 15 is exposed from the organic insulating film 16 at the opening 16c. As shown in FIG. 4 and FIG. 5, the drain electrode 14b and the protruding portion of the capacitor electrode 18a overlap each other at the opening 16c of the organic insulating film 16 via the inorganic insulating film 15, thereby forming a connection region R (see the hatched area in FIG. 4). As shown in FIG. 5, the connection region R has a multilayered structure of the pixel electrode 20a (the uppermost layer)/the capacitor insulating film 19/the capacitor electrode 18a/the inorganic insulating film 15/the drain electrode 14b/the gate insulating film 12/the transparent substrate 10 (the lowermost layer). In FIG. 4, the pixel electrode (20a) provided all over the figure is omitted.

The counter substrate 40 includes, for example, a transparent substrate (not shown), a black matrix (not shown) provided in a grid pattern on the transparent substrate, a plurality of color layers (not shown) including red, green, and blue layers provided between the grid lines of the black matrix, a common electrode (not shown) provided so as to cover the black matrix and each of the color layers, a plurality of columnar photo spacers (not shown) provided on the common electrode, and an alignment film (not shown) provided so as to cover the common electrode and each of the photo spacers.

The liquid crystal layer 45 is made of a nematic liquid crystal material having electro-optic characteristics, or the like.

In the liquid crystal display panel 50 having the above configuration, a predetermined voltage is applied for each sub-pixel P across the liquid crystal layer 45 between the pixel electrode 20a of the TFT array substrate 30a and the common electrode of the counter substrate 40, to change the aligned state of the liquid crystal layer 45, whereby the transmittance of light passing through the panel is adjusted for each sub-pixel P, and thus an image is displayed.

Figure 6:
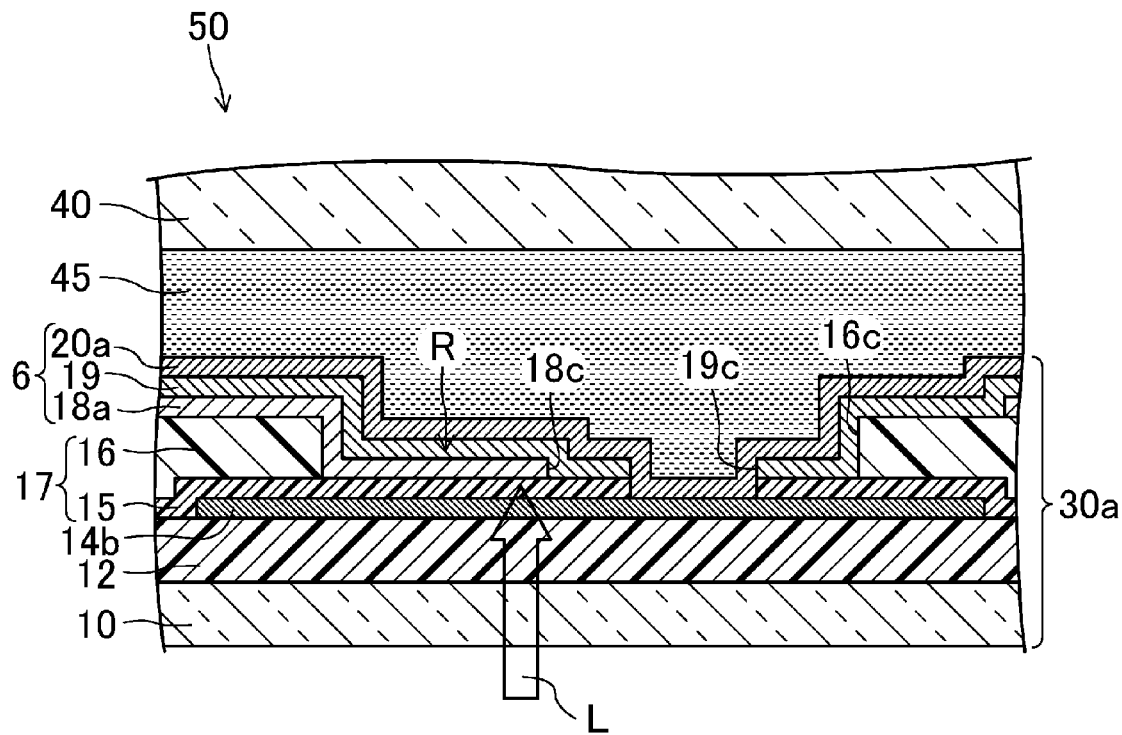
FIG. 6 is a cross-sectional view of the liquid crystal display panel in a repair step.
Figure 7:
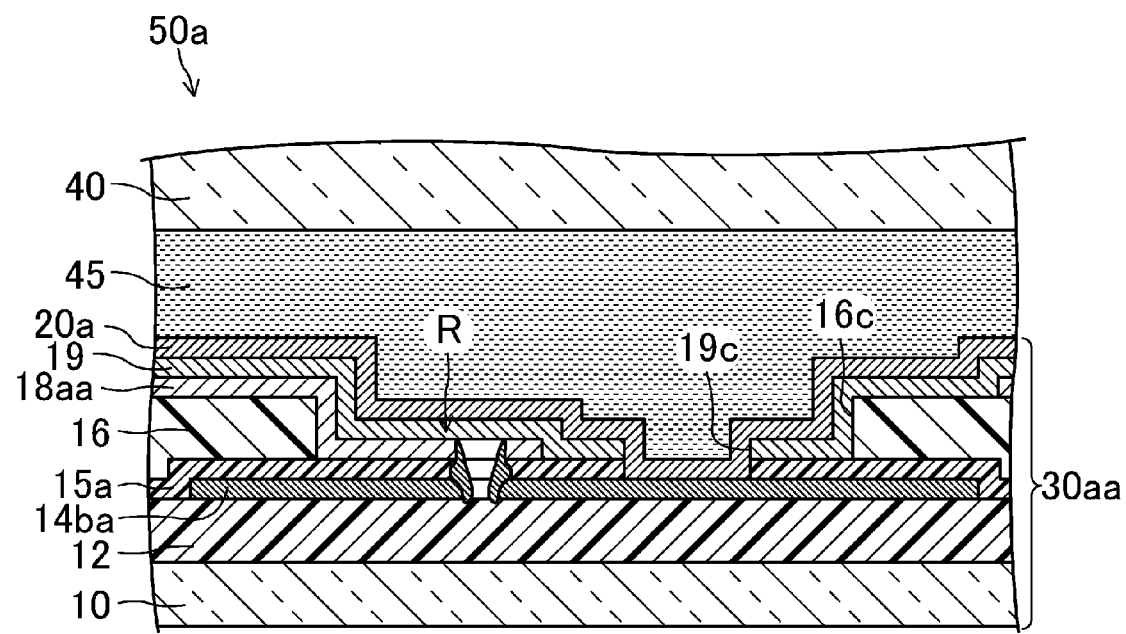
FIG. 7 is a cross-sectional view of the liquid crystal display panel after the repair step shown in FIG. 6.

Next, a method for fabricating a liquid crystal display panel 50a of the present embodiment will be described using FIG. 6 and FIG. 7. Here, the method for fabricating the liquid crystal display panel 50a of the present embodiment includes a step of fabricating a TFT array substrate, a step of fabricating a counter substrate, a step of injecting liquid crystal, a detection step, and a repair step. FIG. 6 is a cross-sectional view of the liquid crystal display panel 50 in the repair step. FIG. 7 is a cross-sectional view of the liquid crystal display panel 50a after the repair step is performed on the liquid crystal display panel 50 in FIG. 6.

<Step of Fabricating TFT Array Substrate>

First, a molybdenum film (having a thickness of about 150 nm) etc. is formed on the entire transparent substrate 10, such as a glass substrate and a plastic substrate, by sputtering, for example. Thereafter, the molybdenum film is subjected to photolithography, etching, and resist removal and cleaning, thereby forming a gate line 11 and a gate electrode 11a. In the present embodiment, a molybdenum film is used to form the gate line 11 and the gate electrode 11a, but a metal film, such as an aluminum film, a tungsten film, a tantalum film, a chromium film, a titanium film, and a copper film, an alloy film of the metal, a nitride film of the metal, or a multilayer film of these films may be used to form the gate line 11 and the gate electrode 11a.

Then, a silicon nitride film (having a thickness of about from 100 nm to 600 nm) is formed by, for example, plasma chemical vapor deposition (CVD) on the entire substrate on which the gate line 11 and the gate electrode 11a are formed, thereby forming a gate insulating film 12. In the present embodiment, a silicon nitride film is used to form the gate insulating film 12, but a single layer film, such as a silicon oxide film (SiOx), a silicon oxide nitride film (SiOxNy, x>y), and a silicon nitride oxide film (SiNxOy, x>y), or a multilayer film of these films may be used to form the gate insulating film 12.

Then, an intrinsic amorphous silicon film (having a thickness of about 100 nm) and an $n^+$ amorphous silicon film (having a thickness of about 50 nm) doped with phosphorus are sequentially formed by, for example, plasma CVD, on the entire substrate on which the gate insulating film 12 is formed. Thereafter, the multilayer film of the intrinsic amorphous silicon film and the $n^+$ amorphous silicon film is subjected to photolithography, etching, and resist removal and cleaning, thereby forming a semiconductor layer formation portion (13).

Further, a titanium film (having a thickness of about from 20 nm to 150 nm) and an aluminum film (having a thickness of about from 50 nm to 400 nm) are sequentially formed by, for example, sputtering, on the entire substrate on which the semiconductor layer formation portion (13) is formed. Thereafter, the metal multilayer film is subjected to photolithography, etching, and resist removal and cleaning, thereby forming a source line 14, a source electrode 14a, and a drain electrode 14b. In the present embodiment, a metal multilayer film of a titanium film and an aluminum film is used to form the source line 14, the source electrode 14a, and the drain electrode 14b, but a metal film, such as an aluminum film, a tungsten film, a molybdenum film, a tantalum film, a chromium film, a titanium film, and a copper film, an alloy film of the metal, a nitride film of the metal, or a multilayer film of these films may be used to form the source line 14, the source electrode 14a, and the drain electrode 14b.

Next, using the source electrode 14a and the drain electrode 14b as a mask, the n$^+$ amorphous silicon film of the semiconductor layer formation portion is etched to form a channel region, thereby forming a semiconductor layer 13 and a TFT 5 having the semiconductor layer 13.

Then, an inorganic insulating film (15), such as a silicon nitride film, a silicon oxide film, and a silicon nitride oxide film, is formed to have a thickness of about 300 nm by, for example, plasma CVD, on the entire substrate on which the TFT 5 is formed.

Further, a photosensitive resin film made of a photosensitive acrylic resin is applied in a thickness of about from 2.0 µm to 4.0 µm by, for example, spin coating or slit coating, on the entire substrate on which the inorganic insulating film (15) is formed. Thereafter, the photosensitive resin film is subjected to exposure, development and baking, thereby forming an organic insulating film 16 having an opening 16c.

Next, a transparent conductive film such as an indium tin oxide (ITO) film is formed to have a thickness of about from 50 nm to 200 nm by, for example, sputtering, on the entire substrate on which the organic insulating film 16 is formed. The transparent conductive film is subjected to photolithography, etching, and resist removal and cleaning, thereby forming a capacitor electrode 18a having an opening 18c.

Then, an inorganic insulating film, such as a silicon nitride film, a silicon oxide film, and a silicon nitride oxide film, is formed to have a thickness of about 300 nm by, for example, plasma CVD, on the entire substrate on which the capacitor electrode 18a is formed. The inorganic insulating film (19) and the previously-formed inorganic insulating film (15) are subjected to photolithography, etching, and resist removal and cleaning, thereby forming an interlayer insulating film 17 including the inorganic insulating film 15 and the organic insulating film 16, and a capacitor insulating film 19 having a contact hole 19c.

Further, a transparent conductive film such as an ITO film is formed to have a thickness of about from 50 nm to 200 nm by, for example, sputtering, on the entire substrate on which the interlayer insulating film 17 and the capacitor insulating film 19 are formed. Thereafter, the transparent conductive film is subjected to photolithography, etching, and resist removal and cleaning, thereby forming a pixel electrode 20a.

Lastly, a polyimide resin is applied by, for example, a printing method on the entire surface on which the pixel electrode 20a is formed. Thereafter, the applied polyimide resin film is subjected to baking and rubbing treatments, thereby forming an alignment film.

The TFT array substrate 30a is obtained by the method described above.

<Step of Fabricating Counter Substrate>

First, a black-colored photosensitive resin is applied by, for example, spin coating or slit coating, on the entire transparent substrate, such as a glass substrate and a plastic substrate. Thereafter, the applied photosensitive resin film is subjected to exposure, development, and baking, thereby forming a black matrix with a thickness of about 1.0 µm.

Next, a red-, green-, or blue-colored photosensitive resin is applied by, for example, spin coating or slit coating, on the entire substrate on which the black matrix is formed. Thereafter, the applied photosensitive resin film is subjected to exposure, development, and baking, thereby forming a color layer of a selected color (e.g., a red color layer) with a thickness of about 2.0 µm. Similar steps are repeated with respect to the other two colors to form color layers of the other two colors (e.g., a green color layer and a blue color layer) with a thickness of about 2.0 µm.

Then, a transparent conductive film such as an ITO film is formed by, for example, sputtering, to have a thickness of about from 50 nm to 200 nm on the entire substrate on which the color layers are formed, thereby forming a common electrode.

Further, a photosensitive resin film made of a photosensitive acrylic resin is applied by, for example, spin coating or slit coating on the entire substrate on which the common electrode is formed. Thereafter, the photosensitive resin film is subjected to exposure, development, and baking, thereby forming a photo spacer with a thickness of about 4.0 µm.

Lastly, a polyimide resin is applied by, for example, a printing method on the entire substrate on which the photo spacer is formed. Thereafter, the applied polyimide resin film is subjected to baking and rubbing treatments, thereby forming an alignment film.

The counter substrate 40 is obtained by the method described above.

<Step of Injecting Liquid Crystal>

First, for example, a sealing material 46 made of an ultraviolet (UV) curable, thermosetting resin or the like is printed in a shape of a frame on the surface of the counter substrate 40 fabricated in the above step of fabricating the counter substrate. Thereafter, a liquid crystal material is dropped onto a region surrounded by the sealing material 46.

Next, the counter substrate 40 on which the liquid crystal material is dropped and the TFT array substrate 30a fabricated in the above step of fabricating the TFT array substrate are bonded together under reduced pressure. Then, the bonded body is released in the atmospheric pressure to apply pressure to the front surface and the back surface of the bonded body.

Then, the sealing material 46 sandwiched in the bonded body is irradiated with UV light, and thereafter the bonded body is heated to cure the sealing material 46.

Lastly, the bonded body with the cured sealing material 46 is cut by dicing, for example, to remove unnecessary portions.

The liquid crystal display panel 50 (before inspection) is obtained by the method described above.

<Detection Step>

In the liquid crystal display panel 50 described above, a gate inspection signal is input to the gate lines 11 to turn on the TFTs 5 of all the sub-pixels P, and a source inspection signal is input to the source lines 14 to input the source inspection signal to the pixel electrode 20a via the TFTs 5. The gate inspection signal is a signal of a bias voltage of −10 V and a pulse voltage of +15 V having a period of 16.7 msec and a pulse width of 50 µsec. The source inspection signal is a signal having a potential of ±2 V with its polarity inverted every 16.7 msec. At the same time, a common electrode inspection signal having a direct current potential of −1 V is input to the common electrode of the counter substrate 40 to input a voltage to the liquid crystal layer 45 between each pixel electrode 20a in the TFT array substrate 30a and the common electrode in the counter substrate 40, thereby turning on each of the sub-pixels P comprised of the pixel electrode 20a. In, e.g., a normally black mode liquid crystal display panel 50 (in which the liquid crystal display panel 50 provides black display when no voltage is applied), the display screen switches from black display to white display at this time. In a sub-pixel P where a short-circuit S (see the dot-dot-dash line in FIG. 2) has occurred between the source electrode 14a and the drain electrode 14b due to film residues, etc., on/off control of the TFT 5 does not work, and the source inspection signal is always input to the pixel electrode 20a. Thus, the sub-pixel P is detected as a bright spot in the black display screen.

<Repair Step>

If a short-circuit S is detected in the detection step, the sub-pixel P detected as having the short-circuit S is irradiated with laser light L at a region X of the drain electrode 14b, as shown in FIG. 2 and FIG. 6, thereby disconnecting the drain electrode 14b at the region X, and is irradiated with laser light L at a region Y in the connection region R, thereby connecting a side of the disconnected drain electrode 14b which side is connected to the pixel electrode 20a, with the capacitor electrode 18a. In the liquid crystal display panel 50a after the repair step shown in FIG. 7, the drain electrode 14b and the capacitor electrode 18a which are connected together are labeled by reference characters 14ba and 18aa, respectively. The inorganic insulating film 15 located therebetween is labeled by a reference character 15a. The TFT array substrate 30a including the drain electrode 14ba, the capacitor electrode 18aa, and the inorganic insulating film 15a is labeled by a reference character 30aa. The laser light L is light output from, e.g., yttrium aluminum garnet (YAG) laser in a spot size of about 2.5 μm×2.5 μm. The liquid crystal display panel 50 can be repaired by being irradiated with laser light, provided that the size of the connection region R is about 5 μm×5 μm or larger.

The liquid crystal display panel 50a in which a defect is repaired by turning the defect into a black spot, is obtained by the method described above.

As described above, according to the liquid crystal display panel 50(50a) of the present embodiment and the method for fabricating the liquid crystal display panel 50(50a), the interlayer insulating film 17 between the drain electrode 14b and the capacitor electrode 18a is formed by sequentially layering the inorganic insulating film 15 and the organic insulating film 16 in the TFT array substrate 30a, and the TFT array substrate 30a has the connection region R where the drain electrode 14b and the capacitor electrode 18a overlap each other via the inorganic insulating film 15 exposed from the organic insulating film 16. This means that in the connection region R where the drain electrode 14b and the capacitor electrode 18a overlap each other, the relatively thick organic insulating film 16 is not provided, but only the relatively thin inorganic insulating film 15 is provided as an insulating film for electrically insulating between the drain electrode 14b and the capacitor electrode 18a. Thus, if a sub-pixel P in which a short-circuit S has occurred between the source electrode 14a and the drain electrode 14b is detected as a bright spot in the detection step by a dynamic operating inspection, the drain electrode 14b of the sub-pixel P in which the short-circuit S has occurred is irradiated with laser light L from the transparent substrate 10 side in the repair step. As a result, the metal of the drain electrode 14b is diffused in the interlayer insulating film 17 (that is, the inorganic insulating film 15 and the organic insulating film 16), and the drain electrode 14b is disconnected. Also, the connection region R where the drain electrode 14b and the capacitor electrode 18a overlap each other via the inorganic insulating film 15 is irradiated with the laser light L from the transparent substrate 10 side. As a result, the metal of the drain electrode 14b is diffused in the relatively thin inorganic insulating film 15, and easily reaches the capacitor electrode 18a. Consequently, it is possible to connect a side of the disconnected drain electrode 14b which side is connected to the pixel electrode 20a, with the capacitor electrode 18a with reliability. Thus, in the sub-pixel P in which the short-circuit S has occurred, the potential of the pixel electrode 20a is fixed to the potential of the capacitor electrode 18a (e.g., ground potential), and the bright spot is turned into a black spot. It is thus possible to connect the drain electrode 14b(14ba) and the capacitor electrode 18a(18aa) with reliability in repairing a defect of the liquid crystal display panel 50(50a) by turning the defect into a black spot.

Second Embodiment of Invention

Figure 8:
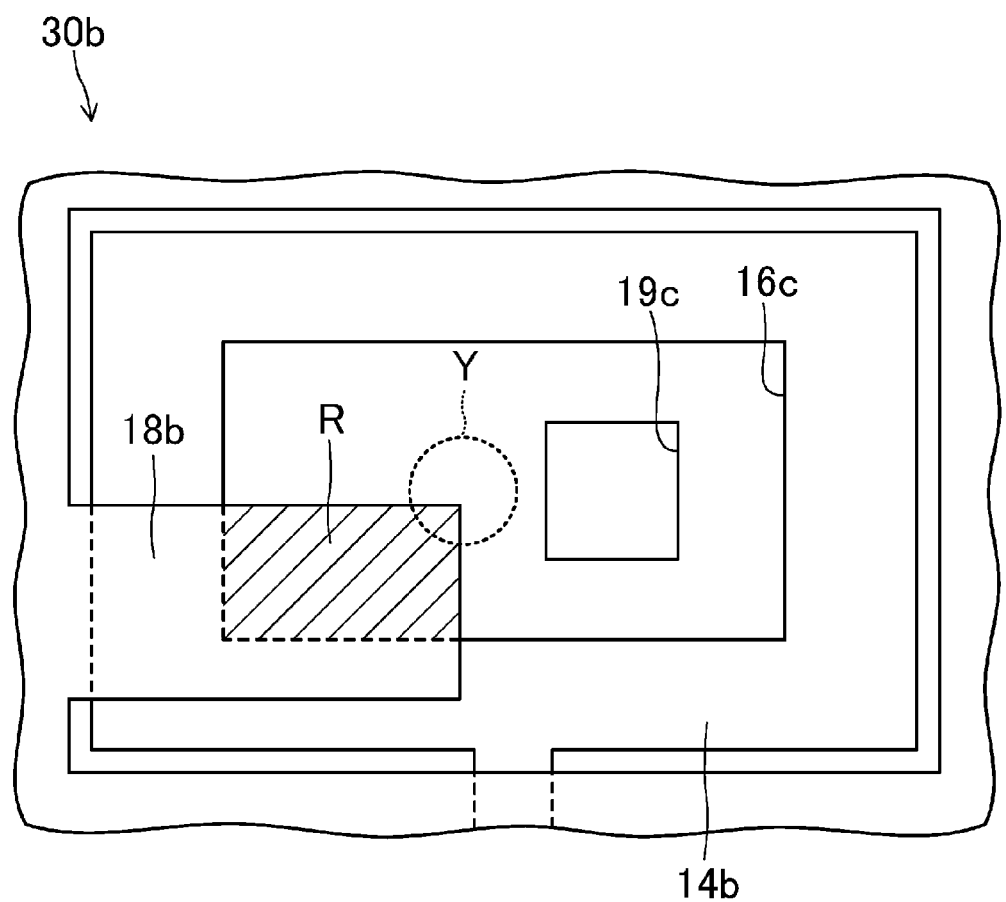
FIG. 8 is an enlarged plan view of a connection region provided at each sub-pixel in a TFT array substrate which comprises a liquid crystal display panel of the second embodiment, and a region adjacent to the connection region.

FIG. 8 is an enlarged plan view of a connection region R provided at each sub-pixel P in a TFT array substrate 30b which comprises a liquid crystal display panel of the present embodiment, and an adjacent region of the connection region R. In FIG. 8, similar to FIG. 4, the pixel electrode (20a) provided all over the figure is omitted. In the following embodiments, like reference characters have been used to designate identical elements in FIG. 1 to FIG. 7, and detailed explanation thereof is omitted.

The first embodiment illustrates a method for fabricating the liquid crystal display panel 50(50a) in which the most part of the region Y irradiated with the laser light L is included in the connection region R. However, the present embodiment illustrates a method for fabricating a liquid crystal display panel in which part of a region Y irradiated with laser light L is included in a connection region R.

The liquid crystal display panel of the present embodiment includes: a TFT array substrate 30b (see FIG. 8) and a counter substrate 40 (see FIG. 1) which face each other; a liquid crystal layer 45 (see FIG. 1) provided between the TFT array substrate 30b and the counter substrate 40; and a sealing material 46 (see FIG. 1) in a frame-like shape which bonds the TFT array substrate 30b and the counter substrate 40 together and encloses the liquid crystal layer 45 between the TFT array substrate 30b and the counter substrate 40.

The TFT array substrate 30b includes: a transparent substrate 10 (see FIG. 3); a plurality of gate lines 11 (see FIG. 2) provided on the transparent substrate 10 and extending in parallel to each other; a gate insulating film 12 (see FIG. 3) provided so as to cover the gate lines 11; a plurality of source lines 14 (see FIG. 2) provided on the gate insulating film 12 and extending in parallel to each other in a direction perpendicular to the gate lines 11; a plurality of TFTs 5 (see FIG. 2 and FIG. 3) each of which is provided for an intersection of the gate line 11 and the source line 14; an interlayer insulating film 17 (see FIG. 3) provided so as to cover the TFTs 5 and the source lines 14; a capacitor electrode 18b (see FIG. 8) provided on the interlayer insulating film 17; a capacitor insulating film 19 (see FIG. 3) provided so as to cover the capacitor electrode 18b; a plurality of pixel electrodes 20a (see FIG. 2 and FIG. 3) which are provided in a matrix manner on the capacitor insulating film 19 and each of which is connected to a corresponding one of the TFTs 5; and an alignment film (not shown) provided so as to cover the pixel electrodes 20a.

In the TFT array substrate 30b, as shown in FIG. 8, the capacitor electrode 18b protrudes to a lower left portion of the opening 16c of the organic insulating film 16. Further, as shown in FIG. 8, the drain electrode 14b and the protruding portion of the capacitor electrode 18b overlap each other at the opening 16c of the organic insulating film 16 via the inorganic insulating film 15, thereby forming a connection region R (see the hatched area in FIG. 8).

The TFT array substrate 30b of the present embodiment and the liquid crystal display panel having the TFT array substrate 30b can be obtained by changing the pattern shape of the capacitor electrode 18a in the step of fabricating the TFT array substrate according to the first embodiment. Similar to the first embodiment, the liquid crystal display panel having the obtained TFT array substrate 30b is subjected to a detection step. If a short-circuit S is detected, a repair step is performed. Specifically, in the repair step, similar to the first embodiment as shown in FIG. 2, the sub-pixel P detected as having a short-circuit S is irradiated with laser light L at a region X of the drain electrode 14b, thereby disconnecting the drain electrode 14b at the region X, and is also irradiated with laser light L at a region Y shown in FIG. 8 which includes an upper right portion of the connection region R shown in the figure and an area outside the connection region R which is adjacent to the connection region R, thereby connecting a side of the disconnected drain electrode 14b which side is connected to the pixel electrode 20a, with the capacitor electrode 18b.

As described above, according to the liquid crystal display panel having the TFT array substrate 30b of the present embodiment and the method for fabricating the liquid crystal display panel, similar to the first embodiment, the interlayer insulating film 17 between the drain electrode 14b and the capacitor electrode 18b is formed by sequentially layering the inorganic insulating film 15 and the organic insulating film 16 in the TFT array substrate 30b, and the TFT array substrate 30b has the connection region R where the drain electrode 14b and the capacitor electrode 18b overlap each other via the inorganic insulating film 15 exposed from the organic insulating film 16. It is thus possible to connect the drain electrode 14b and the capacitor electrode 18b with reliability in repairing a defect of the liquid crystal display panel by turning the defect into a black spot.

Further, according to the liquid crystal display panel having the TFT array substrate 30b of the present embodiment and the method for fabricating the liquid crystal display panel, an edge portion of the connection region R and an area outside the connection region R which is adjacent to the edge portion are irradiated with laser light L in the repair step. This means that the irradiation with the laser light L is not concentrated only onto the connection region R. Thus, it is possible to reduce excessive diffusion of the metal of the drain electrode 14b, and connect the drain electrode 14b and the capacitor electrode 18b with more reliability.

Third Embodiment of Invention

Figure 9:
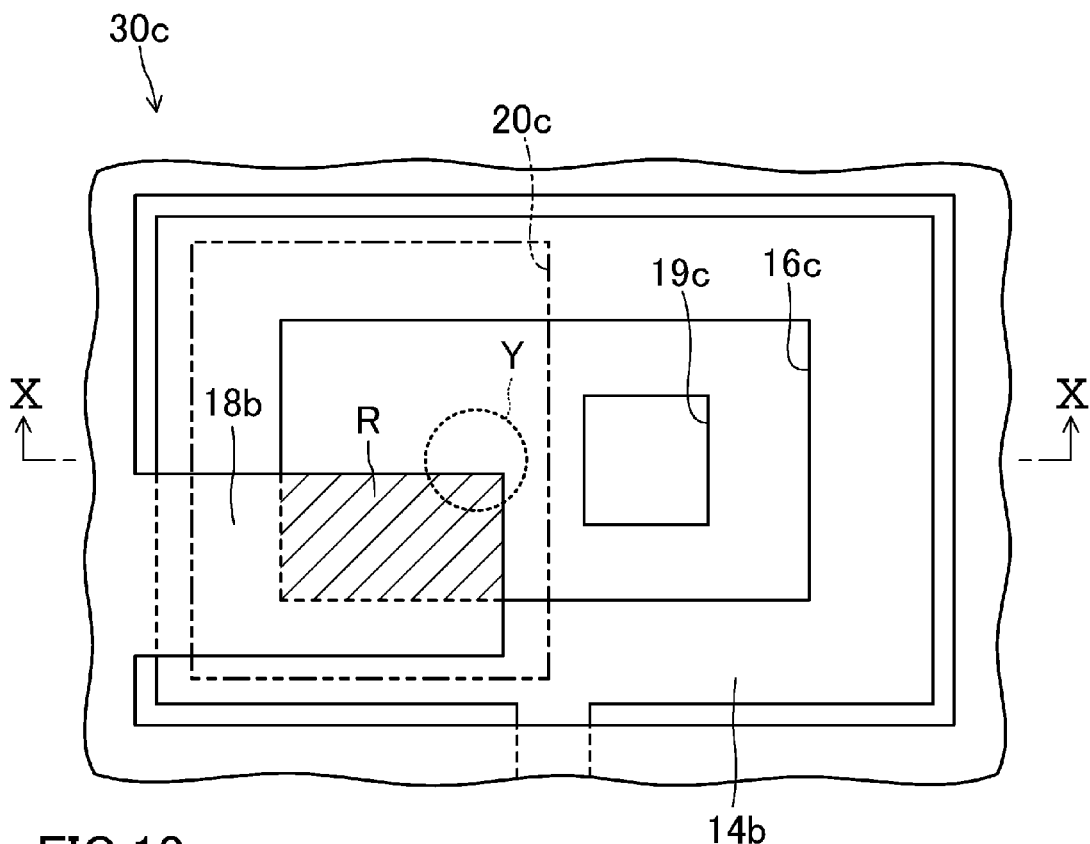
FIG. 9 is an enlarged plan view of a connection region provided at each sub-pixel on a TFT array substrate which comprises a liquid crystal display panel of the third embodiment, and a region adjacent to the connection region.
Figure 10:
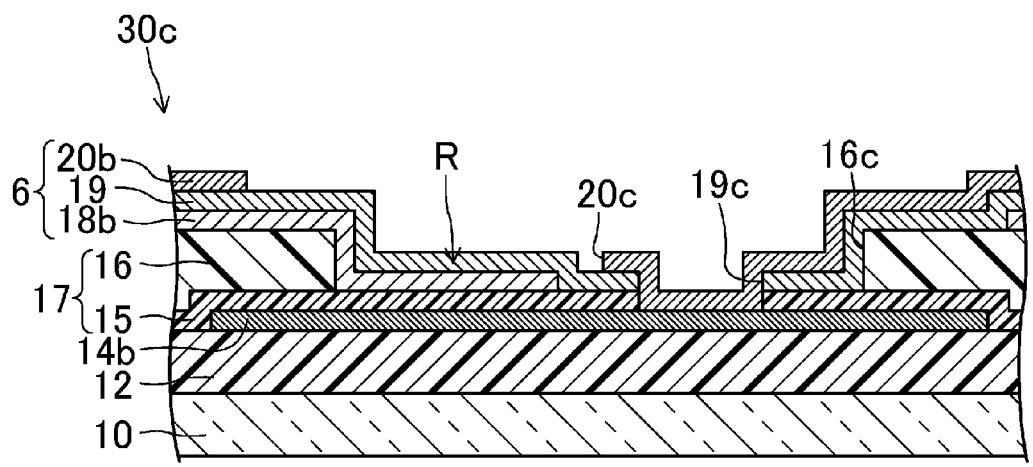
FIG. 10 is a cross-sectional view of the TFT array substrate taken along the line X-X of FIG. 9.

FIG. 9 is an enlarged plan view of a connection region R provided at each sub-pixel P in a TFT array substrate 30c which comprises a liquid crystal display panel of the present embodiment, and an adjacent region of the connection region R. FIG. 10 is a cross-sectional view of the TFT array substrate 30c taken along the line X-X in FIG. 9.

In the above embodiments, the TFT array substrates 30a, 30b in which the pixel electrode 20a overlaps the connection region R are illustrated. In the present embodiment, the TFT array substrate 30c in which a pixel electrode 20b does not overlap the connection region R is illustrated.

The liquid crystal display panel of the present embodiment includes: a TFT array substrate 30c (see FIG. 9 and FIG. 10) and a counter substrate 40 (see FIG. 1) which face each other; a liquid crystal layer 45 (see FIG. 1) provided between the TFT array substrate 30c and the counter substrate 40; and a sealing material 46 (see FIG. 1) in a frame-like shape which bonds the TFT array substrate 30c and the counter substrate 40 together and encloses the liquid crystal layer 45 between the TFT array substrate 30c and the counter substrate 40.

As shown in FIG. 9 and FIG. 10, the TFT array substrate 30c includes: a transparent substrate 10; a plurality of gate lines 11 (see FIG. 2) provided on the transparent substrate 10 and extending in parallel to each other; a gate insulating film 12 provided so as to cover the gate lines 11; a plurality of source lines 14 (see FIG. 2) provided on the gate insulating film 12 and extending in parallel to each other in a direction perpendicular to the gate lines 11; a plurality of TFTs 5 (see FIG. 2 and FIG. 3) each of which is provided for an intersection of the gate line 11 and the source line 14; an interlayer insulating film 17 provided so as to cover the TFTs 5 and the source lines 14; a capacitor electrode 18b provided on the interlayer insulating film 17; a capacitor insulating film 19 provided so as to cover the capacitor electrode 18b; a plurality of pixel electrodes 20b which are provided in a matrix manner on the capacitor insulating film 19 and each of which is connected to a corresponding one of the TFTs 5; and an alignment film (not shown) provided so as to cover the pixel electrodes 20b.

In the TFT array substrate 30c, as shown in FIG. 9, the capacitor electrode 18b protrudes to a lower left portion of the opening 16c of the organic insulating film 16. Further, as shown in FIG. 9 and FIG. 10, the drain electrode 14b and the protruding portion of the capacitor electrode 18b overlap each other at the opening 16c of the organic insulating film 16 via the inorganic insulating film 15, thereby forming a connection region R (see the hatched area in FIG. 9).

In the TFT array substrate 30c, the pixel electrode 20b is provided with an opening 20c which overlaps the connection region R as shown in FIG. 9 and FIG. 10. Here, the opening 20c of the pixel electrode 20b is configured to function as a structure which controls the alignment of the liquid crystal layer 45.

The TFT array substrate 30c of the present embodiment and the liquid crystal display panel having the TFT array substrate 30c can be obtained by changing the pattern shapes of the capacitor electrode 18a and the pixel electrode 20a in the step of fabricating the TFT array substrate according to the first embodiment. Similar to the first embodiment, the liquid crystal display panel having the obtained TFT array substrate 30c is subjected to a detection step. If a short-circuit S is detected, a repair step is performed. Specifically, in the repair step, similar to the first embodiment as shown in FIG. 2, the sub-pixel P detected as having a short-circuit S is irradiated with laser light L at a region X of the drain electrode 14b, thereby disconnecting the drain electrode 14b at the region X, and is also irradiated with laser light L at a region Y shown in FIG. 9 which includes an upper right portion of the connection region R shown in the figure and an adjacent area outside the connection region R, thereby connecting a side of the disconnected drain electrode 14b which side is connected to the pixel electrode 20b, with the capacitor electrode 18b.

As described above, according to the liquid crystal display panel having the TFT array substrate 30c of the present embodiment and the method for fabricating the liquid crystal display panel, similar to the first and second embodiments, the interlayer insulating film 17 between the drain electrode 14b and the capacitor electrode 18b is formed by sequentially layering the inorganic insulating film 15 and the organic insulating film 16 in the TFT array substrate 30c, and the TFT array substrate 30c has a connection region R where the drain electrode 14b and the capacitor electrode 18b overlap each other via the inorganic insulating film 15 exposed from the organic insulating film 16. It is thus possible to connect the drain electrode 14b and the capacitor electrode 18b with reliability in repairing a defect of the liquid crystal display panel by turning the defect into a black spot.

Further, according to the liquid crystal display panel having the TFT array substrate 30c of the present embodiment and the method for fabricating the liquid crystal display panel, an edge portion of the connection region R and an area outside the connection region R which is adjacent to the edge portion are irradiated with laser light L in the repair step. This means that the irradiation with laser light L is not concentrated only onto the connection region R. Thus, it is possible to reduce excessive diffusion of the metal of the drain electrode 14b, and connect the drain electrode 14b and the capacitor electrode 18b with more reliability.

Further, according to the liquid crystal display panel having the TFT array substrate 30c of the present embodiment and the method for fabricating the liquid crystal display panel, each of the pixel electrodes 20b is provided with the opening 20c which overlaps the connection region R and functions as a structure controlling the alignment of the liquid crystal layer 45. It is thus possible to reduce damage of the pixel electrode 20b due to the irradiation of the connection region R with the laser light L.

Fourth Embodiment of Invention

Figure 11:
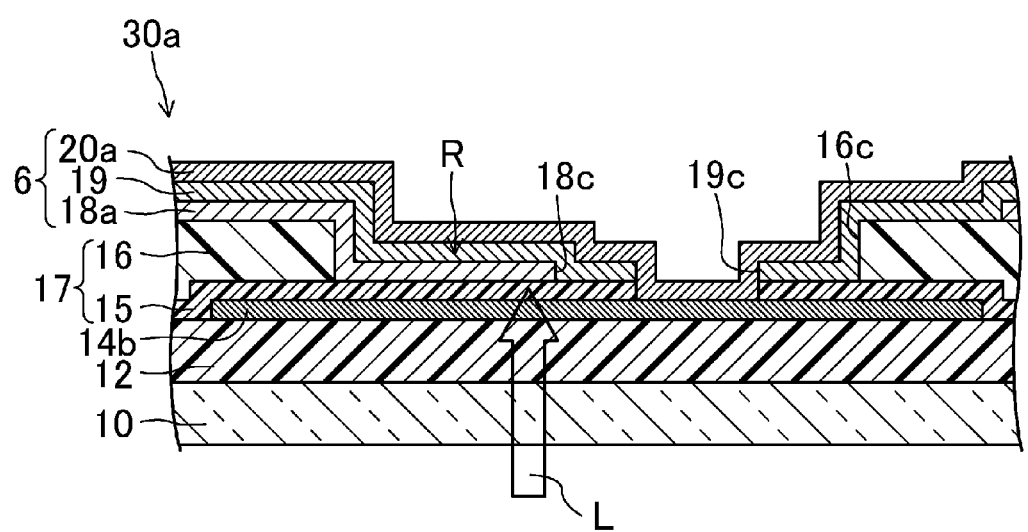
FIG. 11 is a cross-sectional view of a TFT array substrate in a repair step of the fourth embodiment.

FIG. 11 shows a TFT array substrate of an embodiment according to the present disclosure, and a method for fabricating the TFT array substrate. Specifically, FIG. 11 is a cross-sectional view of a TFT array substrate 30a of the present embodiment in a repair step.

In the above embodiments, liquid crystal display panels and methods for fabricating the liquid crystal display panels in which the detection step and the repair step are performed in a panel state are illustrated. In the present embodiment, a TFT array substrate 30a and a method for fabricating the TFT array substrate 30a in which a detection step and a repair step are performed in a substrate state will be illustrated.

The TFT array substrate 30a of the present embodiment is the same as the TFT array substrate 30a in the first embodiment, but may also be TFT array substrate 30b in the second embodiment or the TFT array substrate 30c in the third embodiment.

In the TFT array substrate 30a of the present embodiment, a detection step is performed by detecting a sub-pixel P in which a short-circuit S has occurred between a source electrode 14a and a drain electrode 14b by, for example, an optical inspection using a charge coupled device (CCD) camera, or an inspection by a charge detection method. If a short-circuit S is detected, a repair step is performed. Specifically, in the repair step, the sub-pixel P detected as having a short-circuit S is irradiated with laser light L at the region X (see FIG. 2) of the drain electrode 14b, thereby disconnecting the drain electrode 14b at the region X, and is also irradiated with laser light L at the region Y (see FIG. 4) of the connection region R, as shown in FIG. 11, thereby connecting a side of the disconnected drain electrode 14b which side is connected to the pixel electrode 20a, with the capacitor electrode 18a (see the TFT array substrate 30aa in FIG. 7).

As described above, according to the TFT array substrate 30a of the present embodiment and the method for fabricating the TFT array substrate 30a, the interlayer insulating film 17 between the drain electrode 14b and the capacitor electrode 18a is formed by sequentially layering the inorganic insulating film 15 and the organic insulating film 16, and the TFT array substrate 30a has a connection region R where the drain electrode 14b and the capacitor electrode 18a overlap each other via the inorganic insulating film 15 exposed from the organic insulating film 16. This means that in the connection region R where the drain electrode 14b and the capacitor electrode 18a overlap each other, the relatively thick organic insulating film 16 is not provided, but only the relatively thin inorganic insulating film 15 is provided as an insulating film for electrically insulating between the drain electrode 14b and the capacitor electrode 18a. Thus, if a sub-pixel P is detected as having a short-circuit S between the source electrode 14a and the drain electrode 14b by an optical inspection or an inspection by a charge detection method in the detection step, the drain electrode 14b of the sub-pixel P in which the short-circuit S has occurred is irradiated with laser light L from the transparent substrate 10 side in the repair step. As a result, the metal of the drain electrode 14b is diffused in the interlayer insulating film 17 (that is, the inorganic insulating film 15 and the organic insulating film 16), and the drain electrode 14b is disconnected. Also, the connection region R where the drain electrode 14b and the capacitor electrode 18a overlap each other via the inorganic insulating film 15 is irradiated with laser light L from the transparent substrate 10 side. As a result, the metal of the drain electrode 14b is diffused in the relatively thin inorganic insulating film 15, and easily reaches the capacitor electrode 18a. Consequently, it is possible to connect a side of the disconnected drain electrode 14b which side is connected to the pixel electrode 20a, with the capacitor electrode 18a with reliability. Thus, in the sub-pixel P in which the short-circuit S has occurred, the potential of the pixel electrode 20a is fixed to the potential of the capacitor electrode 18a (e.g., ground potential), and a bright spot is turned into a black spot. It is thus possible to connect the drain electrode 14b and the capacitor electrode 18a with reliability in repairing a defect of the TFT array substrate 30a by turning the defect into a black spot.

In the above embodiments, the repair methods in which the drain electrode 14b is disconnected are illustrated. However, instead of disconnecting the drain electrode 14b, the source electrode 14a may be disconnected at a base portion thereof if the source electrode 14a can be disconnected.

In the above embodiments, TFTs are illustrated as a switching element, but the present disclosure may also be applied to other 3-terminal switching elements, such as metal oxide semiconductor field effect transistors (MOSFETs).

In the above embodiments, each pixel is illustrated as having three sub-pixels (i.e., red, green and blue sub-pixels), but the present disclosure may be applied to a liquid crystal display panel including pixels each of which has four or more sub-pixels (e.g., red, green, blue and white sub-pixels, or red, green, blue and yellow sub-pixels).

In the above embodiments, the array substrate in which a plurality of sub-pixels are arranged in a matrix, and the liquid crystal display panel having the array substrate are illustrated, but the present disclosure may be applied to an array substrate in which a plurality of sub-pixels are arranged in a delta pattern, and a liquid crystal display panel having such an array substrate.

In the above embodiments, the TFT array substrate in which the electrode of the TFT connected to the pixel electrode is a drain electrode is illustrated, but the present disclosure may also be applied to a TFT array substrate in which the electrode of the TFT connected to the pixel electrode is called a source electrode.

INDUSTRIAL APPLICABILITY

As described above, according to the present disclosure, a drain electrode and a capacitor electrode are connected with reliability in repairing a defect by turning the defect into a black spot. Thus, the present disclosure is suitable for a display panel having an auxiliary capacitor.

DESCRIPTION OF REFERENCE CHARACTERS

L laser light
P sub-pixel
R connection region
S short-circuit
5 TFT (switching element)
6 auxiliary capacitor
10 transparent substrate
12 gate insulating film
14a source electrode
14b drain electrode
15, 15a inorganic insulating film
16 organic insulating film
17 interlayer insulating film
18a, 18b capacitor electrode
19 capacitor insulating film
20a, 20b pixel electrode
20c opening
30a, 30aa, 30b, 30c TFT array substrate
40 counter substrate
45 liquid crystal layer
50, 50a liquid crystal display panel

The invention claimed is:

1. A liquid crystal display panel, comprising:
a plurality of sub-pixels;
an array substrate and a counter substrate which face each other; and
a liquid crystal layer provided between the array substrate and the counter substrate, and
the array substrate including
a plurality of switching elements each provided on a transparent substrate for a corresponding one of the plurality of sub-pixels and having a source electrode and a drain electrode spaced apart from each other,
an interlayer insulating film provided so as to cover the plurality of switching elements and including an inorganic insulating film and an organic insulating film sequentially layered,
a capacitor electrode provided on the interlayer insulating film,
a capacitor insulating film provided so as to cover the capacitor electrode, and
a plurality of pixel electrodes which are provided on the capacitor insulating film to face the capacitor electrode, and each of which forms an auxiliary capacitor for a corresponding one of the plurality of sub-pixels, and is connected to the drain electrode of a corresponding one of the plurality of switching elements, while being insulated from the capacitor electrode, wherein
the array substrate includes a connection region at which the drain electrode and the capacitor electrode overlap each other via the inorganic insulating film exposed from the organic insulating film.

2. The liquid crystal display panel of claim 1, wherein each of the plurality of pixel electrodes is provided with an opening which overlaps the connection region.

3. The liquid crystal display panel of claim 1, wherein in the connection region of the array substrate, a gate insulating film, the drain electrode, the inorganic insulating film, the capacitor electrode, the capacitor insulating film, and each of the plurality of pixel electrodes are sequentially layered on the transparent substrate.

4. A method for fabricating a liquid crystal display panel, including:
a plurality of sub-pixels;
an array substrate and a counter substrate which face each other; and
a liquid crystal layer provided between the array substrate and the counter substrate, and
the array substrate including
a plurality of switching elements each provided on a transparent substrate for a corresponding one of the plurality of sub-pixels and having a source electrode and a drain electrode spaced apart from each other,
an interlayer insulating film provided so as to cover the plurality of switching elements and including an inorganic insulating film and an organic insulating film sequentially layered,
a capacitor electrode provided on the interlayer insulating film,
a capacitor insulating film provided so as to cover the capacitor electrode,
a plurality of pixel electrodes which are provided on the capacitor insulating film to face the capacitor electrode, and each of which forms an auxiliary capacitor for a corresponding one of the plurality of sub-pixels, and is connected to the drain electrode of a corresponding one of the plurality of switching elements, while being insulated from the capacitor electrode, and
the array substrate including a connection region at which the drain electrode and the capacitor electrode overlap each other via the inorganic insulating film exposed form the organic insulating film, the method comprising:
a detection step for detecting, in the plurality of sub-pixels, a sub-pixel in which a short-circuit has occurred between the source electrode and the drain electrode; and
a repair step in which the drain electrode of the sub-pixel detected as having the short-circuit in the detection step is irradiated with laser light from a transparent substrate side, thereby disconnecting the drain electrode, and in which the connection region is irradiated with laser light from the transparent substrate side, thereby connecting a side of the disconnected drain electrode which side is connected to a corresponding one of the pixel electrodes, with the capacitor electrode.

5. The method of claim 4, wherein
in the repair step, the connection region is irradiated with the laser light at an edge portion thereof and an area outside the connection region that is adjacent to the edge portion.

6. An array substrate, comprising:
a plurality of sub-pixels;
a plurality of switching elements each provided on a transparent substrate for a corresponding one of the plurality of sub-pixels and having a source electrode and a drain electrode spaced apart from each other;
an interlayer insulating film provided so as to cover the plurality of switching elements and including an inorganic insulating film and an organic insulating film sequentially layered;
a capacitor electrode provided on the interlayer insulating film;
a capacitor insulating film provided so as to cover the capacitor electrode; and
a plurality of pixel electrodes which are provided on the capacitor insulating film to face the capacitor electrode, and each of which forms an auxiliary capacitor for a corresponding one of the plurality of sub-pixels, and is connected to the drain electrode of a corresponding one of the plurality of switching elements, while being insulated from the capacitor electrode, wherein the array substrate includes a connection region at which the drain electrode and the capacitor electrode overlap each other via the inorganic insulating film exposed from the organic insulating film.

7. A method for fabricating an array substrate, including:
a plurality of sub-pixels;
a plurality of switching elements each provided on a transparent substrate for a corresponding one of the plurality of sub-pixels and having a source electrode and a drain electrode spaced apart from each other;
an interlayer insulating film provided so as to cover the plurality of switching elements and including an inorganic insulating film and an organic insulating film sequentially layered;
a capacitor electrode provided on the interlayer insulating film;
a capacitor insulating film provided so as to cover the capacitor electrode;
a plurality of pixel electrodes which are provided on the capacitor insulating film to face the capacitor electrode, and each of which forms an auxiliary capacitor for a corresponding one of the plurality of sub-pixels, and is connected to the drain electrode of a corresponding one of the plurality of switching elements, while being insulated from the capacitor electrode; and
a connection region at which the drain electrode and the capacitor electrode overlap each other via the inorganic insulating film exposed from the organic insulating film, the method comprising
a detection step for detecting, in the plurality of sub-pixels, a sub-pixel in which a short-circuit has occurred between the source electrode and the drain electrode, and
a repair step in which the drain electrode of the sub-pixel detected as having the short-circuit in the detection step is irradiated with laser light from a transparent substrate side, thereby disconnecting the drain electrode, and in which the connection region is irradiated with laser light from the transparent substrate side, thereby connecting a side of the disconnected drain electrode which side is connected to a corresponding one of the pixel electrodes, with the capacitor electrode.

8. The liquid crystal display panel of claim 1, wherein
each of the plurality of switching elements is a thin film transistor including a semiconductor layer made of an oxide semiconductor.

9. The liquid crystal display panel of claim 8, wherein
the oxide semiconductor is an In—Ga—Zn—O based oxide semiconductor.

10. The method of claim 4, wherein
each of the plurality of switching elements is a thin film transistor including a semiconductor layer made of an oxide semiconductor.

11. The method of claim 10, wherein
the oxide semiconductor is an In—Ga—Zn—O based oxide semiconductor.

12. The array substrate of claim 6, wherein
each of the plurality of switching elements is a thin film transistor including a semiconductor layer made of an oxide semiconductor.

13. The array substrate of claim 12, wherein
the oxide semiconductor is an In—Ga—Zn—O based oxide semiconductor.

14. The method of claim 7, wherein
each of the plurality of switching elements is a thin film transistor including a semiconductor layer made of an oxide semiconductor.

15. The method of claim 14, wherein
the oxide semiconductor is an In—Ga—Zn—O based oxide semiconductor.

* * * * *